United States Patent
Tabatabaei

(10) Patent No.: US 7,844,022 B2
(45) Date of Patent: Nov. 30, 2010

(54) JITTER SPECTRUM ANALYSIS USING RANDOM SAMPLING (RS)

(75) Inventor: Sassan Tabatabaei, Sunnyvale, CA (US)

(73) Assignee: Guide Technology, Inc., Sunnyvale, CA (US)

(*) Notice: Subject to any disclaimer, the term of this patent is extended or adjusted under 35 U.S.C. 154(b) by 992 days.

(21) Appl. No.: 11/590,652

(22) Filed: Oct. 31, 2006

(65) Prior Publication Data
US 2007/0110146 A1    May 17, 2007

Related U.S. Application Data

(60) Provisional application No. 60/731,746, filed on Oct. 31, 2005.

(51) Int. Cl.
*H04L 7/00* (2006.01)
(52) U.S. Cl. .................................. 375/371; 375/360
(58) Field of Classification Search .............. 375/371, 375/354–355, 346, 360
See application file for complete search history.

(56) References Cited

U.S. PATENT DOCUMENTS

| | | | |
|---|---|---|---|
| 2002/0084972 A1* | 7/2002 | Kim .......................... | 345/99 |
| 2003/0125888 A1* | 7/2003 | Yamaguchi et al. .......... | 702/69 |
| 2004/0143406 A1* | 7/2004 | Nishikobara et al. ......... | 702/69 |
| 2005/0149801 A1* | 7/2005 | Oshima ..................... | 714/731 |
| 2005/0156622 A1* | 7/2005 | Roziere et al. ............... | 326/16 |
| 2006/0045175 A1* | 3/2006 | Draving et al. .............. | 375/224 |
| 2007/0133726 A1* | 6/2007 | Nadig et al. ................. | 375/360 |
| 2009/0019324 A1* | 1/2009 | Miller et al. ................. | 714/700 |

* cited by examiner

*Primary Examiner*—Emmanuel Bayard
(74) *Attorney, Agent, or Firm*—Dority & Manning, PA

(57) ABSTRACT

The present subject matter is directed to methodologies for measuring jitter spectral content in a sampled signal using continuous time interval analyzers (CTIA) for characterization and test of clock signals and high-speed digital interfaces. The methodology takes advantage of anti-aliasing aspects of random sampling (RS) in a time interval error (TIE) based analysis methodology by randomizing timing of samples relative to signal edges and/or intervals between signal edges.

15 Claims, 7 Drawing Sheets

JITTER SPECTRUM ANALYSIS USING RANDOM SAMPLING (RS)

CROSS REFERENCE TO RELATED APPLICATIONS

This application claims priority under 35 USC 119(e) of Provisional Patent Application Ser. No. 60/731,746 filed Oct. 31, 2005, entitled "Jitter Spectrum Analysis Using Continuous Time Interval Analysis (CTIA)" which is hereby incorporated by reference in its entirety.

FIELD OF THE INVENTION

The present subject matter relates to jitter spectral analysis. More particularly, the present subject matter relates to jitter spectral analysis using random sampling (RS) methodologies in a continuous time interval analysis (CTIA).

BACKGROUND OF THE INVENTION

The advent of Multi-Gbps serial interfaces computer and consumer electronics has renewed significant interest in physical data link signal integrity issues, such as channel distortion and jitter performance of transmitter, receiver, and transmission media. In addition to other requirements, such interfaces must meet stringent jitter requirements to ensure system level functionality, especially when the system includes devices from multiple vendors. Governing standards for each interface type specify definitions and/or limits for various jitter parameters, including random, deterministic, and total components for the transmitter (jitter generation) and minimum tolerable limits for the receiver (jitter tolerance). Such standards are discussed in various publications including: "Supplement to Carrier Sense Multiple Access with Collision Detection (CSMA/CD) Access Method & Physical Layer Specifications, XGMII Extended Sublayer (XGXS) and 10 Gigabit Attachment Unit Interface (XAUI)", IEEE Draft P802.3ae/D3.3, October 2001; National Committee for Information Technology Standardization (NCITS), "Fiber Channel Methodologies for Jitter and Signal Quality Specification (MJSQ)", T11.2/Project 1316-DT/Rev 10.0, March 2003; and "Infiniband Architecture, Chapter 6: High Speed Electrical Signaling –2.5 Gb/s Physical Specifications" Release 1.0, Vol. 2, October 2000.

Jitter may be defined as deviations of signal edges from their ideal positions in time and is generally divided into four components: random jitter (RJ), data-dependent jitter (DDJ), periodic jitter (PJ), and bounded uncorrelated jitter (BUJ). Each of these components is correlated with one or more physical sources and impact bit error rate (BER) differently.

Random jitter is assumed to be unbounded and have a Gaussian distribution, while the combination of data-dependent jitter (DDJ) and periodic jitter (PJ) are bounded and can be traced back to deterministic sources including but not limited to transmission path bandwidth limitations and cross-coupling. Bounded uncorrelated jitter (BUJ) is typically a result of on-chip or off-chip cross-coupling. These components have to be characterized for different elements of a link to identify their source and to reduce them to an acceptable level. In addition, they have to be tested in production directly or indirectly to guarantee the desired quality level for the shipped devices.

Many methodologies exist for jitter analysis and test, including statistical, time domain, and frequency domain methods using a variety of equipment including spectrum analyzers, oscilloscopes (both real-time and undersampling), and bit-error rate analyzers. Representative such methodologies have been disclosed by: Y. Cai, S. A. Werner, G. J. Zhang, M. J. Olsen, R. D. Brink, "Jitter Testing for Multi-Gigabit Backplane SerDes—Techniques to Decompose and Combine Various Types of Jitter", International Test Conference, 2002, pp 700-709; Agilent Technologies, "Measuring jitter in digital systems", Application note 1448-1, Jun. 1, 2003; and M. P. Li, J. Wilstrup, R. Jessen; D. Petrich; "A new method for jitter decomposition through its distribution tail fitting", International Test Conference, 1999, pp 788-794.

One technique that provides a unique view of jitter behavior is jitter spectrum analysis, which can provide estimates of random jitter (RJ), data-dependent jitter (DDJ), and especially periodic jitter (PJ). Known jitter spectrum estimation methods include the use of a real-time digital sampling oscilloscope (RT-DSO). Exemplary real-time digital sampling oscilloscopes sample signals at 20 Gsps or higher, which allows fairly accurate estimation of all the signal threshold-crossings within a capture window. These estimates, which may be interpolated for the missing transitions in the data pattern, provide estimate of time interval error (TIE) sequence, which are in fact samples of the jitter signal. Fast Fourier Transform (FFT) of the time interval error (TIE) or jitter autocorrelation sequence, $\psi_J(\tau)$, yields the jitter spectrum, which are theoretically related as follows:

$$FFT\{\psi_J\} = |FFT\{TIE\}|^2$$

An alternative approach uses the oscilloscope samples in conjunction with Hilbert transforms to view the signal phase/jitter spectrum. The latter can reduce the number of samples required to extract specific jitter parameters from the spectrum.

Yet another approach involves the use of a bit error rate tester (BERT). The use of a bit error rate tester (BERT) is a well-accepted method for measuring total jitter assuming proper clock recovery filters are available. Following bit errors over time with BERT can provide some information about periodicity of jitter, which can be viewed as partial jitter spectrum.

A still further approach involves the use of a time interval analyzer (TIA). TIAs measure the time difference between two transitions and often use a time interval variance method for jitter spectrum analysis, which is a variation of the auto-correlation approach. An advantage of TIAs is that they can measure the difference between threshold-crossing directly without edge interpolation or modeling that oscilloscopes require. This typically leads to faster and more accurate test times.

TIAs can capture data over a much longer time window than oscilloscopes, which provides better observability for low frequency jitter. However, they often require re-arming time between two subsequent measurements, which can be on the order of a few hundred nanoseconds to a few microseconds, resulting in effective sampling rates in a few hundred kHz to a few MHz range. For signals in the Gbps or GHz range, hundreds of edges may be missed between two adjacent samples. This can cause the under sampling of the jitter signal, as the jitter may have frequency content above the effective sampling rate of the TIA.

In light of this shortfall, special techniques are required to estimate the jitter spectrum over a wide range of frequencies without losing frequency or amplitude information due to aliasing or other effects. One such technique uses a time interval variance or N-variance method. This method, which can also be implemented with oscilloscopes, computes a sequence such that each element corresponds to the variance of time intervals that span a specific number of bits. This sequence is a representation of jitter autocorrelation, which can easily yield the jitter power spectral density through Fast Fourier Transform (FFT).

While various implementations of jitter spectral analysis have been developed, no design has emerged that generally encompasses all of the desired characteristics as hereafter presented in accordance with the present subject matter.

SUMMARY OF THE INVENTION

The present subject matter relates to jitter spectral analysis using continuous time interval analysis (CTIA). It has been found that the use of CTIA is an attractive solution as such use can provide high bandwidth, fast measurement, and excellent accuracy. In one of its simpler forms, CTIA measures the occurrence time of selected edges in a signal relative to a unique reference, i.e., it stamps each edge relative to that reference.

Another positive aspect of continuous time interval analysis (CTIA) is its capability to program event numbers for all sampled edges relative to the unique reference.

In accordance with certain aspects of the present subject matter, methodologies have been developed to employ random sampling as an analysis method thereby taking advantage of its anti-aliasing property.

Additional objects and advantages of the present subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
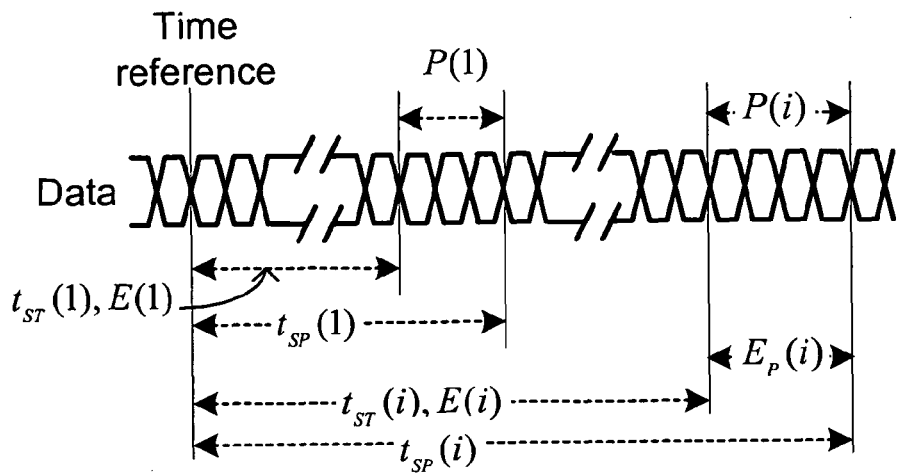
FIG. 1 graphically illustrates the operational principle of a continuous time interval analyzer (CTIA) in accordance with the present subject matter.

Repeat use of reference characters throughout the present specification and appended drawings is intended to represent same or analogous features or elements of the invention.

DETAILED DESCRIPTION OF THE PREFERRED EMBODIMENTS

As discussed in the Summary of the Invention section, the present subject matter is particularly concerned with jitter spectral analysis using continuous time interval analysis (CTIA) with random sampling methodologies.

Selected combinations of aspects of the disclosed technology correspond to a plurality of different embodiments of the present invention. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference will now be made in detail to the presently preferred embodiments of the subject continuous time interval analyzer (CTIA). CTIA is an instrument that can produce accurate timing information of many events within a signal relative to a common reference. In serial communications, events may be defined as rising and/or falling edges. An ideal CTIA will be able to measure the occurrence time for all the edges in a specified segment of a signal. However, real CTIAs typically measure time interval between two events once every $T_s$ seconds. $T_s$ is the time required by the CTIA internal circuitries to complete a time interval measurement and is often in the range of a few hundred nano-seconds to a few micro-seconds. Since the bit-rate of many modern systems is more than 1 Gbps, such CTIAs will miss many events between two consecutive measurements, effectively undersampling the signal edge timing variations or jitter content.

Generally, there are several methods that may be used to measure Periodic Jitter (PJ). These include, but are not limited to, demodulation methods, statistical methods, high rate jitter sampling, and jitter under sampling techniques using hardware recovery filters, autocorrelation methods, and random sampling methods.

A first measurement methodology involves demodulation. Timing jitter is, in fact, a phase modulation process, therefore, phase demodulation techniques may be used to isolate jitter information. Exemplary phase demodulation techniques may employ phase locked loops (PLLs), phase discriminator filters, and phase detectors combined with reference signal generators or delay lines. These techniques generally require high-speed circuitry to analyze the signal frequency content and generate a phase modulation signal, which in turn can be sampled and analyzed with digital signal processing (DSP) techniques. A non-limiting example for such techniques corresponds to a FFT algorithm that can separate periodic jitter (PJ).

A second measurement methodology involves statistical methods. Such methods rely on the bounded property of periodic jitter (PJ). Typically an oscilloscope or time interval analyzer (TIA) measures the jitter samples and produces a histogram that provides a statistical representation of the jitter. If other deterministic jitter components such as DDJ and BUJ are eliminated, the remaining bounded jitter is assumed to be PJ. The main issue of this method is PJ filtering, which is desired in many applications to reduce the impact of low frequency jitter in the measurements. This may be accomplished either through hardware, which may be difficult to implement, or through hardware or software programmable clock recovery filters.

Yet another measurement method involves high rate jitter sampling. Sample phase/timing deviations for all the transitions in the signal to represent jitter with highest sampling rate possible. This can be done with real-time sampling oscilloscope that allows high-sampling rates. The resulting jitter samples can be analyzed to separate PJ components in frequency domain, apply PJ filtering, and compute the total PJ.

Finally, there are several measurement forms involving jitter under sampling techniques. These techniques include the use of hardware clock recovery filters, autocorrelation methods, and random sampling methods. Some equipment cannot measure jitter samples with high sampling rates, that is, they under sample jitter. Examples of such equipment are equivalent-time sampling oscilloscope, and TIAs/CTIAs. Uniform under sampling causes alias of high frequency jitter components to low frequency, making it difficult to apply jitter filtering.

To maintain PJ filtering capability, various methods, including the following, are possible. A first method involves the use of hardware clock recovery filters. Such filters are in fact PLLs with given frequency response. In such case, the method measures correct PJ amplitudes, even though the frequencies are ambiguous.

A second method involves the use of autocorrelation methodologies. Capability to measure two jitter samples that can be taken arbitrarily close to each other (down to 1 UI) in a programmable fashion make it possible to estimate jitter autocorrelation function. The FFT of autocorrelation function yields the jitter power spectral density (PSD), which includes PJ information. This method is mostly suitable to TIAs/CTIAs because they typically generate 2 or more jitter samples that can be 1 UI apart, but somewhat difficult for ET-DSO, because it only generates one sample for every few micro-seconds.

A third method involves the use of random sampling methodologies. The random sampling theory suggests that randomization of sampling interval can randomize the aliasing signal components, effectively spreading their power over a large frequency range. This allows for detection of periodic components even at frequencies much higher than the average sampling rate. This is often referred to as anti-aliasing property of random sampling. Generally, this method only requires one jitter sample for each sampling interval, making it applicable to TIA/CTIA and also ET-DSO.

Referring now to the drawings, as shown in FIG. 1, a typical CTIA generates the following information for each sampled time interval:

$t(i)=t_{ST}(i)$ START time tag relative to the common reference time.

$t_{SP}(i)$ STOP time tag relative to the common reference time.

E(i) START event number relative to the common reference.

P(i) The time interval between START and STOP edges. $P(i)=t_{SP}(i)-t_{ST}(i)$ $E_P(i)$ The number of events between START and STOP edges of a time interval Each time interval P(i) has an associated event and unit interval (UI) span, denoted by $E_P$ and $B_P$, which represent the number of events and data bits between the time interval start and stop events, respectively. UI is defined as the ideal bit period, and is estimated as the average bit interval. The $B_P$ span can generally be obtained from the E sequence and knowledge of the reference edge, but it may also be estimated from P if P deviates less than half UI from its ideal value.

For implementing random sampling, the elements of E sequence are selected randomly relative to each other, provided that the minimum event separation between any two adjacent elements is larger than a threshold set by the CTIA minimum sampling interval limitation. This sampling regime allows measuring PJ amplitude and frequency even for frequencies up to half of the bit rate, while the effective sampling rate could be hundreds or thousands of times less than the bit rate.

It should be noted that throughout the following data is assumed to be a repetitive pattern with the following pattern parameters:

pat Pattern definition in the form of a 0 and 1 sequence.
ppat Number of positive or negative edges in the pattern.
patLen Pattern length in bits
$bitLocRise_r(q)/bitLocFall_r(q)$ The location of the pattern rising/falling edges relative to the first rising edge for the pattern rotated right by r bits.

Other parameters used herein include:
UI Unit interval. The ideal bit time.
$b_{ST}(i)/b_{SP}(i)$ The bit location for the START/STOP edges of the i-th time interval sample relative to the reference edge.

Time interval error (TIE) estimation may be defined as the edge timing variation relative to its ideal location in time. TIE contains critical information for measuring a wide variety of jitter parameters, including jitter spectrum. Assuming that the ideal position is defined with a jitter-free ideal clock with the period of UI, the TIE is computed as follows:

$$TIE_{ST}(i)=t(i)-b_{ST}(i)*UI$$

$$TIE_{SP}(i)=t(i)+P(i)-b_{SP}(i)*UI \qquad \text{Eq. 1}$$

From Eq. 1, UI, $b_{ST}(i)$ and $b_{SP}(i)$ are needed to compute $TIE_{ST}(i)$ and $TIE_{SP}(i)$. The average UI is typically a good approximation of the ideal UI. In general, in order to compute UI, $b_{ST}(i)$, and $b_{SP}(i)$, it is necessary to determine which pattern edge is occurring at the beginning of the sampled data set. In other words, the sampled data set should be synchronized with a unique rotation of the pattern pat.

An exemplary pattern synchronization method is described as follows: Rotate the pattern pat by r bits. For each pattern rotation, compute $bitLocRise_r(q)$ and $bitLocFall_r(q)$. Assuming that the first edge of this pattern rotation occurs at the beginning of the sample set, all the edge bit locations are computed as follows:

$$b_{ST,r}(i) = \left\lceil \frac{E(i)-E(1)}{ppat} \right\rceil \cdot patLen + bitLocRise_r\left(rem\left(\frac{E(i)-E(1)}{ppat}, ppat\right)\right) \quad \text{Eq. 2}$$

where rem(X, N) is the remainder of X to N, and [X] represents the integer part of X. The STOP edge bit locations, $b_{SP,r}(i)$, are computed in a similar way by replacing E(i) with $E(i)+E_P(i)$ in Eq. 2.

An estimate of UI can be obtained using the following:

$$UI_r = \frac{t(N)-t(1)}{b_{ST,r}(N)-b_{ST,r}(1)} \quad \text{Eq. 3}$$

From knowledge of bit location and $UI_r$, a cost function can be defined based on the RMS value of the difference between the estimated ideal edge time and the measured edge time. Alternative cost functions are also possible, such as the RMS value of the ideal time intervals minus their measured value. Both cost functions are subject to the inherent jitter in the signal under test as well as the pattern rotation. The former is more robust against high frequency jitter, while the latter is less susceptible to low frequency jitter. The rotation that minimizes both cost functions simultaneously determines the correct pattern rotation whose first edge is occurring at the beginning of the data set. This method performs the pattern synchronization correctly even in the presence of up to 20UI of high frequency jitter and up to hundreds of UI for signals with low frequency jitter, which is sometimes encountered in low-cost clock sources used for serial input/output (I/O) operations.

A Direct Autocorrelation methodology may be undertaken as follows. Assume $\tau_J(n)$ represents the time deviation (or jitter) of a clock or data signal edges. For a stationary and periodic jitter random process, the $\tau_J(n)$ autocorrelation sequence, $\psi_{\tau\tau}$, is given by:

$$\psi_{\tau\tau}(m) = E[\tau_J(n)\tau_J(n+m)] \quad \text{Eq. 4}$$

where m is the lag index. To estimate $\psi_{\tau\tau}$ with CTIA, N time interval samples are measured, such that the time intervals P cover a to b periods for clock or bits for data signals. The sampling should be performed such that the data set includes multiple samples for each bit span. As described above, the CTIA allows estimation of TIE sequence for each sampled edge $TIE_{ST}(i)$ and $TIE_{SP}(i)$, which can be viewed as two jitter samples with a time delay of $P_{ideal}(i)$ relative to each other, i.e.:

$$\tau_J(n_i) = TIE_{ST}(i)$$

$$\tau_J(n_i+m) = TIE_{SP}(i) \quad \text{Eqn. 5}$$

where, $n_i$ is the estimate of sampling time in UI for the i-th sample, $m = round(P_{ideal}(n_i)/UI)$ is the lag time in UI or bits, and $\tau_J(n_i)$ are samples of the jitter signal. Therefore, time interval measurements with different values of m provide an estimate of jitter signal and its delayed version for different lag values.

Assume $M_m$ samples are taken for each lag m. This forms the basis for estimating the jitter autocorrelation function $\psi_{\tau\tau}(m)$ based upon Eq. 4, as follows:

$$\psi_{\tau\tau}(m) = \frac{1}{M_m} \sum_{i=1}^{M_m} TIE_{ST}(i) \cdot TIE_{SP}(i) \bigg|_{P_{ideal}=m\cdot UI} \quad \text{Eq. 6}$$

$$= \frac{1}{M_m} \sum_{i=1}^{M_m} \tau_J(n_i)\tau_J(n_i+m)$$

For a stationary jitter signal $\tau_J$, the $\psi_{\tau\tau}(m)$ values are independent of $n_i$ if the values of $n_i$ are selected randomly and $M_m \to \infty$ to ensure the averaging operation in Eq. 6 yields $\psi_{\tau\tau}(m)$ as defined in Eq. 4. Taking the FFT of the autocorrelation sequence $\psi_{\tau\tau}(m)$ yields the jitter power spectrum density (PSD) function, $\Psi(m)$. Note that $\psi_{\tau\tau}(m)$ may not exist for some values of m, in which case, the interpolation may be used to construct a uniformly sampled $\psi_{\tau\tau}(m)$.

For reducing the test time, the average value of $M_m$ is often limited to between 10 and 100. This can cause statistical variations or noise for each $\psi_{\tau\tau}(m)$ element. Such noise appears as a synthetic noise floor, which reduces the power spectrum density (PSD) dynamic range. To demonstrate this phenomenon, assume that the jitter signal is a single sinusoid, i.e., $\tau_J(n) = A_1 \cdot \cos(\omega \cdot UI \cdot n)$. Therefore the direct autocorrelation is obtained from:

$$\psi_{\tau\tau}(m) = \frac{A_1^2}{M_m} \sum_{i=1}^{M_m} \cos(\omega \cdot UI \cdot (n_i+m))\cos(\omega \cdot UI \cdot n_i) \quad \text{Eq. 7}$$

$$= \frac{A_1^2}{2}\cos(\omega \cdot UI \cdot m) + \frac{A_1^2}{2M_m} \sum_{i=1}^{M_m} \cos(\omega \cdot UI \cdot (2n_i+m))$$

The second term in Eq. 7 acts as a noise component. For $M_m = 100$ the dynamic range is roughly 23 db. For comparison, the N-variance method relates to the autocorrelation as follows:

$$\psi_V(m) = \frac{1}{2M_m} \sum_{i=1}^{M_m} (\tau_j(n_i+m) - \tau_j(n_i))^2 \quad \text{Eq. 8}$$

$$= \frac{1}{2M_m} \sum_{i=1}^{M_m} [(\tau_j(n_i+m))^2] -$$

$$\frac{1}{2M_m} \sum_{i=1}^{M_m} (\tau_J(n_i+m) \cdot \tau_J(n_i))$$

$$= \frac{A_1^2}{2M_m} \sum_{i=1}^{M_m} (\cos(\omega \cdot UI \cdot (n_i+m)) - \cos(\omega \cdot UI \cdot n_i))^2$$

$$\psi_V(m) = \frac{A_1^2}{2}(1-\cos(\omega \cdot UI \cdot m)) - \quad \text{Eq. 9}$$

$$\frac{A_1^2(1-\cos(\omega \cdot UI \cdot m))}{2M_m} \sum_{i=1}^{M_m} \cos(\omega \cdot UI \cdot (2n_i+m))$$

The second term in Eq. 9 has the additional factor $(1-\cos(\omega \cdot UI \cdot m))$ in the numerator relative to Eq. 7, which gives rise to 3 db increase in noise floor. The main reason for this rise in noise floor is the statistical variation of the first term in Eq. 8.

This term converges to a constant for large number of samples, but contributes to the noise floor when finite number of samples is used in practical applications.

A Random Sampling Methodology in accordance with the present subject matter may be undertaken as follows. Assume the signal x(t) with the Fourier Transform X(ω) is sampled at the sampling times $T_s(i)$, i=1, ..., N to yield the sampled signal $x_s(i)$. In a uniform sampling application, the time between any two adjacent samples is constant, i.e., $T_s(i+1)-T_s(i)=T_u$. Uniform sampling, however, is subject to the Nyquist sampling limit, which causes aliasing of any frequency component above $f_E=1/(2T_u)$ to another frequency in the range 0 to $f_E$. When using FFT to detect PJ peaks, the frequency resolution is proportional to $1/T_s(N)$.

In a random sampling process, $T_s(i)$, i=1, ..., N elements are selected randomly relative to each other. For a practical implementation, often $T_s$ sequence is selected as follows:

$$T_s(i+1)-T_s(i)=T_u+M(i)*T_a \quad \text{Eq. 10}$$

where $T_u$ is the average sampling rate, $T_a<T_u$ is the time step whose multiples vary the instantaneous sampling rate, and M(i) is a sequence of randomly selected integers with mean of zero such that $T_u+M(i)*T_a>0$ to ensure monotonously increasing sampling time instances.

The Fourier Transform of the sequence $x_s(i)$ can be computed using either a Sinusoidal Correlation or a Fast Fourier Transform (FFT) technique. The Sinusoidal Correlation technique is based on computing the correlation of a series of sine and cosine basis functions with $x_s(t)$ for different frequencies:

$$X_s(\omega) = \frac{1}{N}\sum_{i=1}^{N} x_s(i)e^{j\omega T_s(i)} \quad \text{Eq. 11}$$

The angular frequency ω=2πf can be selected arbitrarily, but typically the range f=0,1/$T_s(N)$, ..., 1/$T_a$ provides most of the signal frequency component information. The computation in Eq. 11 can take a long time when repeated for a large frequency set, but has the advantage that it can be performed only for small frequency ranges of interest to optimize processing time.

The FFT method is applicable when $T_u$ is an exact multiple of $T_a$, i.e.:

$$T_u/T_a=K, K \text{ is an integer} \quad \text{Eq. 12}$$

To run FFT, zero insertion is used to create a signal from $x_s(i)$ that contains approximately $N_A$=K.N samples, such that all samples are zero except for the instances for which samples of $x_s(i)$ exist:

$$\hat{x}_s(n) = \begin{cases} x_s(i) & T_s(i)/T_a = n, i = 1, ..., N \\ 0 & \text{otherwise} \end{cases} \quad \text{Eq. 13}$$

Figure 2:
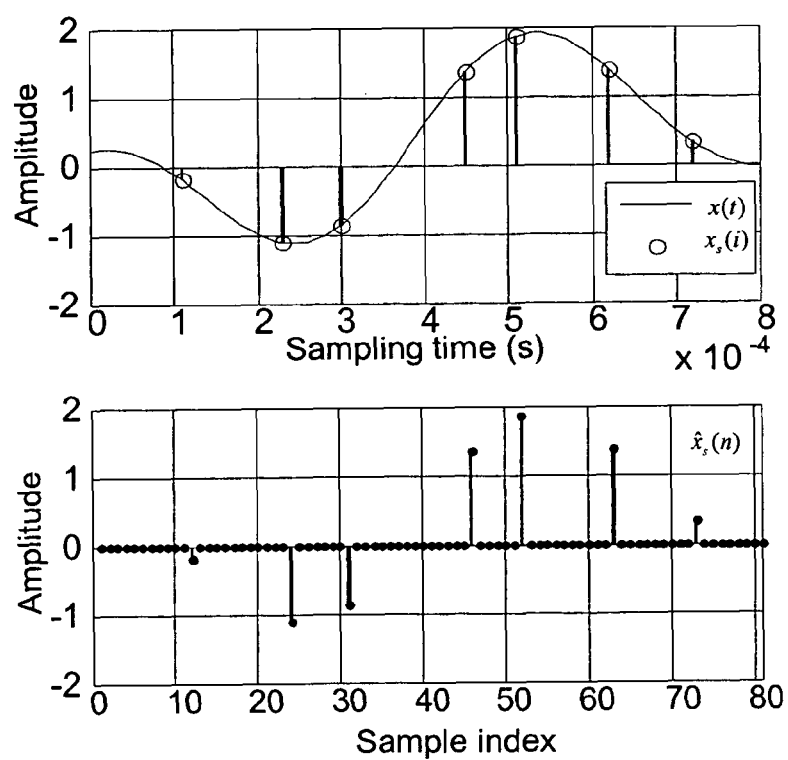
FIG. 2 is a graphical representation of the concept of zero insertion for constructing a uniformly sampled signal.

$\hat{x}_s(n)$ is a uniformly sampled signal, which can be processed with FFT:

$$X_s(\Omega)=FFT\{\hat{x}_s(n)\} \quad \text{Eq. 14}$$

where $\Omega=2\pi k/N_A$, k=0, ..., $N_A$−1 is the discrete angular frequency, which is related to the continuous angular frequency through ω=Ω/$T_a$. FIG. 2 illustrates an example of x(t), $x_s(i)$ and the derived $\hat{x}(n)$.

Random sampling effectively randomizes the aliased components, spreading their energy in the noise floor rather than showing them as distinct peaks in the frequency domain. In other words, $X_s(\omega)$ contains the main frequency components as of X(ω), but with an increased noise floor due to randomized aliasing. As a result, the analysis of randomly selected samples in frequency domain provides an estimate of periodic signal components at frequencies much higher than the average sampling rate. This property of random sampling is referred to as "anti-aliasing".

The condition in Eq. 11 is assumed valid when analyzing jitter spectrum of data or clock signals with CTIA because the ideal edge sampling times are always an integer multiple of the UI. This condition allows us to define the following relationships:

$$x_s[i]=x_s(T_s(i)), n=T_s(i)/T_a, i=1, ..., N$$

$$\hat{x}_s[m]=\hat{x}_s(t), t=m/T_a, m=1, ..., N_A \quad \text{Eq. 15}$$

If the sampling is sufficiently randomized, an effective sampling rate of $1/T_a$ may be achieved when computing $X_s(f)$. For example, $T_u$=100 ns, $T_a$=0.5 ns, and M(i)∈{−100, −99, ..., 99, 100} will yield the average sampling rate of 10 Ms/s, the minimum sampling interval of 50 ns, and the effective sampling rate of 2 GHz.

The following example illustrates this anti-aliasing property of random sampling. Let x(t) be a signal composed of three sinusoidal components at 1 MHz, 107 MHz and 455 MHz:

$$x(t)=a_1 \cdot \cos(\omega_1 \cdot t)+a_2 \cdot \cos(\omega_2 \cdot t)+a_3 \cdot \cos(\omega_3 \cdot t)$$

$$\omega=2\pi \cdot 10^7, \omega_1=2\pi \cdot 107 \cdot 10^6, \omega_1=2\pi \cdot 455 \cdot 10^6 \quad \text{Eqn. 16}$$

Assume x(t) is sampled in two different ways to yield $x_{s0}(t)$ and $x^{s1}(t)$ as follows:

$$x_{s0}(t):T_u=100 \text{ ns}, T_a=0 \text{(uniform sampling)} \quad \text{Eqn. 17}$$

$$x_{s1}(t):T_u=100 \text{ ns}, T_a=1n, -25<M(i)<25 \quad \text{Eqn. 18}$$

(M(i) randomly selected)

Figure 9:
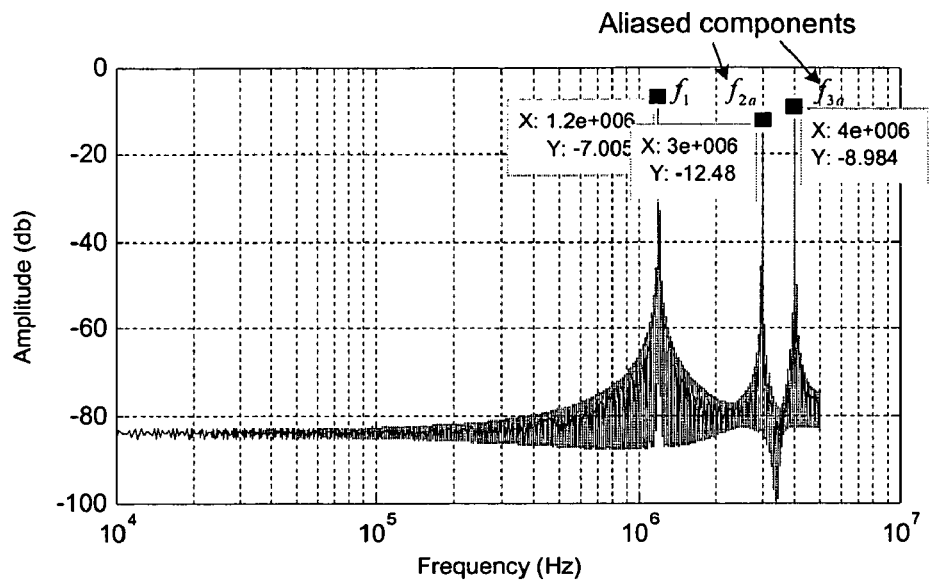
FIG. 9 illustrates jitter spectrum with uniformly sampled signal.
Figure 10:
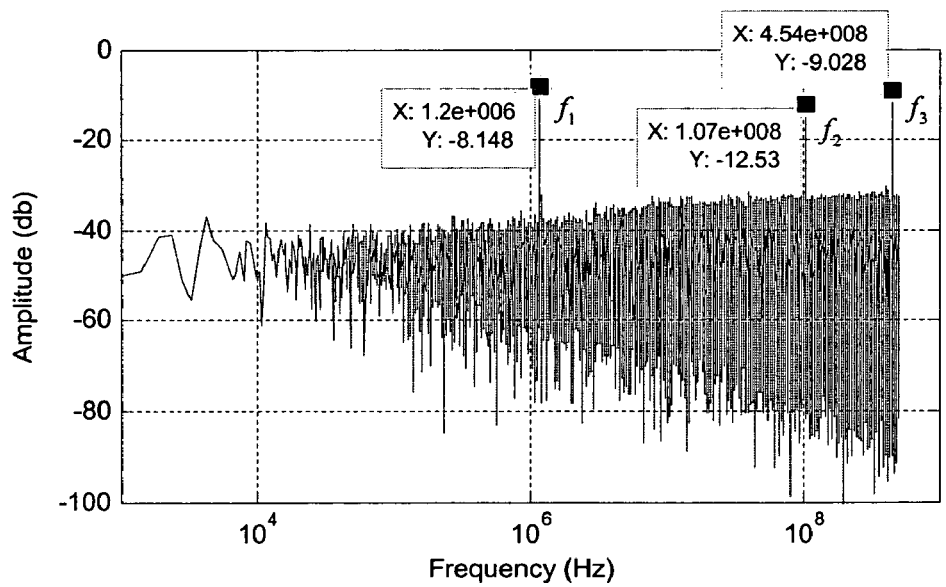
FIG. 10 illustrates jitter spectrum with randomly sampled signal in accordance with the present subject matter.

FIG. 9 and FIG. 10 show the $X_{s0}(f)$ and $X_{s1}(f)$ which represents $x_{s0}(t)$ and $x_{s1}(t)$ in frequency domain, respectively. The anti-aliasing property of random sampling can clearly be observed in FIG. 10. One important observation is that the noise floor of $X_{s1}(f)$ is much larger than that of $X_{s0}(f)$. This is due to randomization of the alias components.

Figure 11:
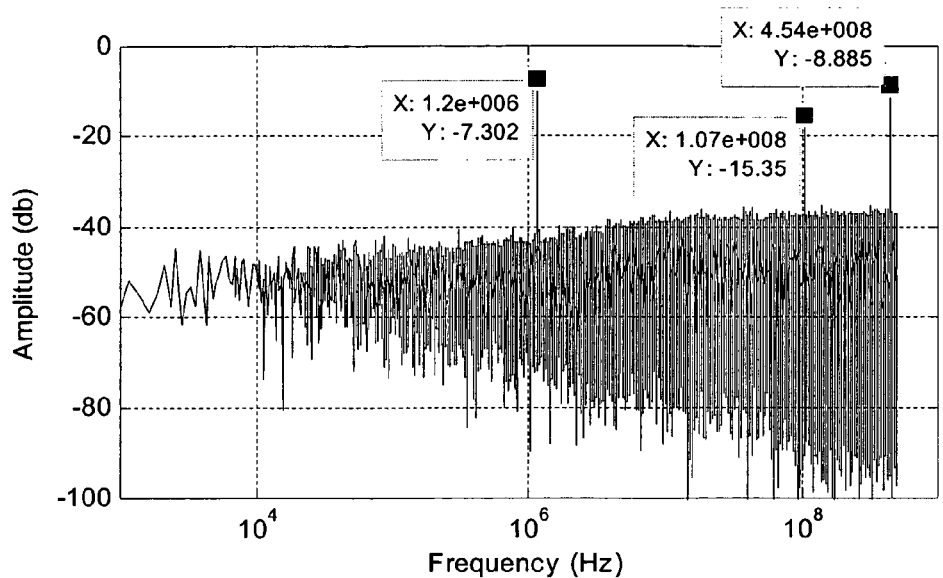
FIG. 11 illustrates noise floor reduction by increasing the number of samples.

The $X_s(f)$ noise floor due to the randomized aliased components can be reduced using a larger sample size N or by successive elimination methods. Increasing the number of samples reduces the noise floor. FIG. 11 illustrates a 6 db improvement in dynamic range may be expected for Example 1 when increasing N by a factor of 4. Successive elimination may be used to detect the largest frequency components and subtract them from $x_s(i)$. This will reduce the contribution of the largest component to the noise floor and improve the detection of other components. This can be further performed multiple times to detect even small components.

Figure 12:
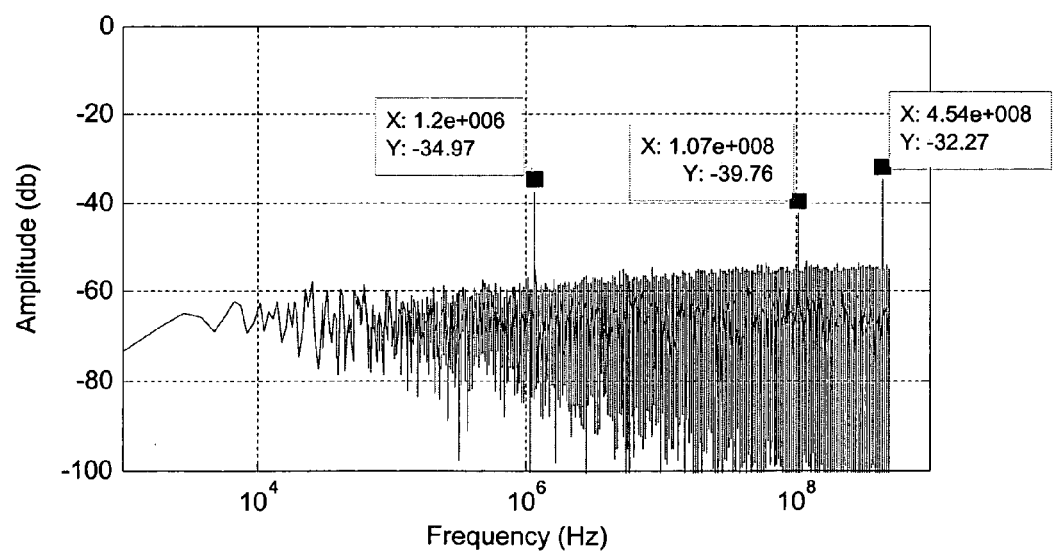
FIG. 12 illustrates jitter spectrum dynamic range increases using successive elimination.

FIG. 12 illustrates the successive elimination technique result for the Example 1, in which the noise floor is reduced by 20 db. Note that the residual components at f1, f2, and f3 are due to errors in estimating the amplitude or phase of each component before elimination.

Like FFT of uniformly sampled signal, the Fourier Transform of randomly sampled signal is subject to windowing effects and side lobe issues. Therefore, optional windowing can be applied to the samples prior to Fourier Transform computation to reduce the side lobes associated with rectangular window. The windowing coefficients have to be generated for $x_s(t)$ with the effective sampling rate of $f_a=1/T_a$, or generate window coefficients only at times $T_s(i)$. For example, in the case of Kaiser window, the following will generate the required window coefficients w(m):

$$w(m) = \begin{cases} \dfrac{I_0\left[\beta(1-[(m-\alpha)/\alpha]^2)^{1/2}\right]}{I_0(\beta)} & m = \dfrac{T_s(i)}{T_a}, i=1,\ldots,N \\ 0, & \text{otherwise} \end{cases} \quad \text{Eq. 19}$$

where $\alpha=(N_A-1)/2$, $N_A$ is the length of $x_s(t)$ sequence, $\beta$ is the window parameter, and $I_0(.)$ is the zero-order modified Bessel function of the first kind, which is given by:

$$I_0(x) = \sum_{k=0}^{\infty}\left[\dfrac{(x/2)^k}{k!}\right]^2 \quad \text{Eq. 20}$$

Normally, using only the first 20 elements of the summation in Eq. 20 is sufficient for obtaining $I_0(.)$ accurately. The window is applied to the data to generate windowed sequence $x_{ws}(i)=x_s(i).w(i)$, $i=1,\ldots,N$.

Windowing causes loss of signal energy. Therefore, the total energy of windowed sequence and also the frequency peaks do not match that of non-windowed sequence. Therefore, it may be necessary to compensate the windowing loss by using a scaling factor $k_2$. Because windowing is equivalent to convolution in frequency domain, a scaling factor that normalizes the maximum of $|W_s(\omega)|=|FFT[w_s(m)]|$ to 1 will maintain the true value of maximum peaks in frequency domain:

$$k_2 = \dfrac{N_A}{\max|W_s(\omega)|} \quad \text{Eq. 21}$$

Also, any DC component of $x_{ws}(i)$ will produce peaks at zero frequency, which can lead to distortion at frequencies close to zero and cause loss of accuracy in estimating low frequency periodic jitter (PJ). To avoid this problem, the DC component $k_1$ is subtracted from $x_s(m)$, where $k_1$ is computed from below:

$$k_1 = \dfrac{\sum_{k=1}^{N_A} w(k)x_{ws}(k)}{\sum_{k=1}^{N_A} w(k)} \quad \text{Eq. 22}$$

Applying $k_1$ and $k_2$, results in the following widowed sequence:

$$x_{s\_w}(i)=k_2.(x_s(i)-k_1).w(i) \quad \text{Eq. 23}$$

For efficient measurement of different jitter parameters, the CTIA must provide a feature to program the event number sequence in a uniform or random fashion. The GuideTech GT4000 is an example of such equipment. This is necessary to capture different edges in the signal that contain maximum information for the target jitter parameters.

To use random sampling, a measurement set of a single time tag per sample and associated event numbers are sufficient, however the time interval information (from second time tag) usually helps to synchronize the captured samples with the pattern; it also provide more samples for increasing the jitter spectral analysis dynamic range.

For efficient measurement of different jitter parameters, the CTIA provides a feature to program the event number sequence. This is necessary to capture different edges in the signal that contain maximum information for the target jitter parameters.

To use random sampling, the time tags and event numbers are sufficient, however the time interval information usually helps to synchronize the captured samples with the pattern; it also provide more samples for increasing the jitter spectral analysis dynamic range.

Figure 3:
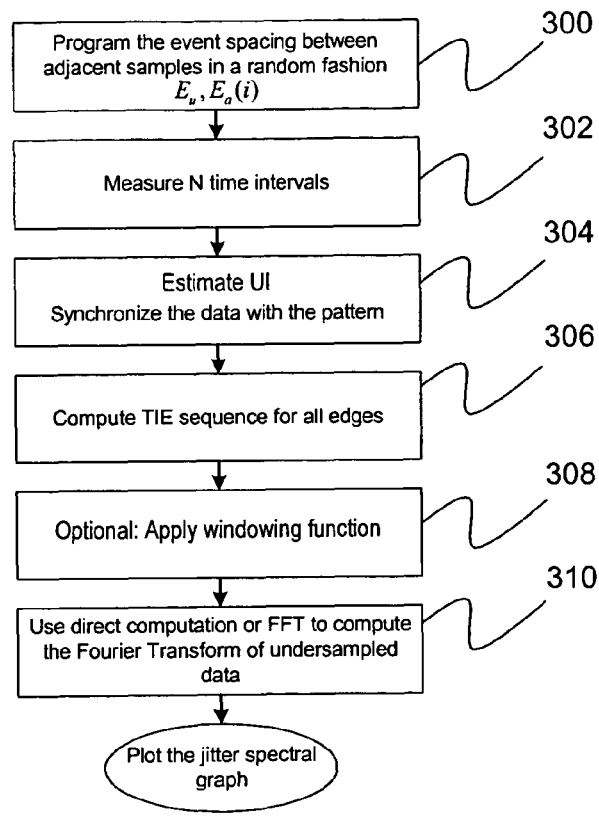
FIG. 3 is a flow chart representing Jitter analysis implementation steps using CTIA with random sampling in accordance with the present subject matter.
Figure 13:
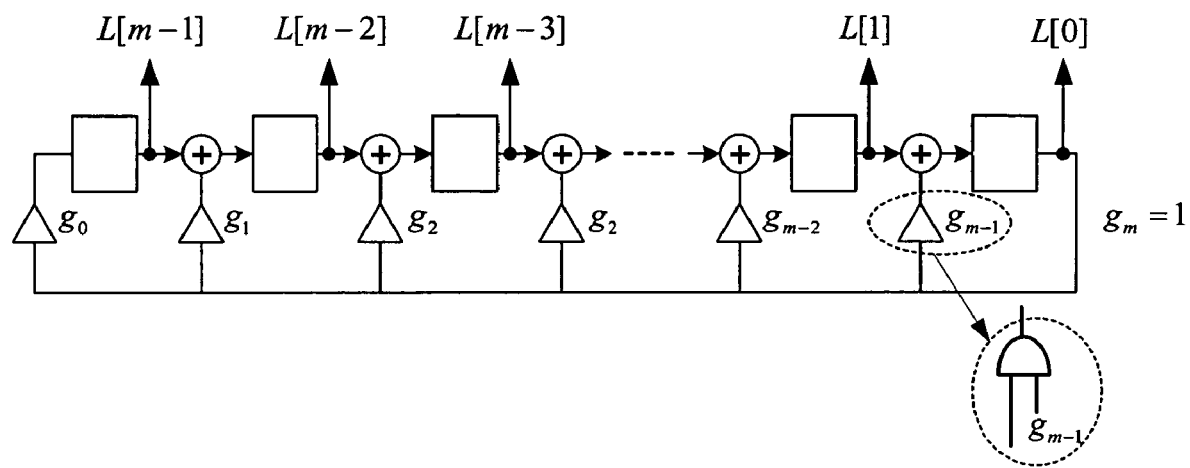
FIG. 13 is a schematic diagram illustrating a circuit for generation of pseudo-randomly selected sampling edges.

The flowchart in FIG. 3 shows different steps necessary to compute the jitter spectral plot. The following describes each step in more detail. The first step, step 300, is to ensure that the edges are selected in a random or pseudo-random manner. Many different implementations are possible, for example, the sequence E can be selected as below:

$$E(i+1)-E(i)=E_u+E_a(i), i=1,\ldots,N \quad \text{Eq. 24}$$

where $E_u$ is a constant number and $E_a(i)$ is pseudo-random sequence, e.g., generated with a Linear Feedback Shift Register (LFSR). Since the jitter sampling time is E(i).UI, randomization of event number effectively provides random sampling regime. It is important to select the $E_a(i)$ sequence in a range that is approximately within $-E_u/4$ to $E_u/4$ to achieve sufficient randomization without violating the CTIA minimum sampling interval requirement. FIG. 13 illustrates a schematic diagram of a LFSR circuit for generating long pseudo random sequences for $E_a(i)$ ($E_a(i)=L[m-1,\ldots,0]$) for the i-th clock edge.

Event numbers should be programmed as in the previous step. Select $E_u$ such that the average time between two consecutive samples for the given data pattern is larger than minimum sampling rate supported by the equipment. This selection depends on the bit rate and the pattern event density (patDen) defined as the ratio of the number of bits to the number of events in the pattern. For example, assume the average sampling time is 1 μs, the data signal bit rate is 2.5 Gbps, and the data pattern is the repetitive PRBS7. This scenario yields the following $E_u$ estimate:

$$E_u = \dfrac{\overline{\Delta T_s}}{(UI)(patDen)} = \dfrac{10^{-6}}{(400.10^{-12})\cdot(127/32)} = 630 \quad \text{Eq. 25}$$

A second step, step 302, is to measure a block of data.

A third step, step 304, in the process is to estimate average UI. Different methods can be used to estimate UI, including searching for events that span multiple pattern repetitions, and use of synchronization algorithms. To compute TIE for each sampled edge, first synchronize the data signal with the pattern. This is necessary to find the bit location for each sampled edge relative to other edges then compute TEE.

It should be noted that the random sampling principle applies to any sample extracted from the samples within a block, including the time interval or pulse widths (P) samples, or any other derivative of the samples. For example, the same anti-aliasing characteristics will operate on the P samples. The advantage of using time intervals instead of TIE is lower noise floor when the signal includes significant low frequency random jitter (phase noise), which is powerful technique for applying random sampling to many real signals used in industry.

Prior to the fifth step, an optional windowing step shown as step 308 may be performed. In the fifth step, step 310, the computed TIE and the event sequence can be used to calculate the jitter spectral content. Depending on the required number of samples, and the value of $E_u$, the FFT method may require computing FFT of a very large sequence, which demands large amounts of memory, but is efficient in terms of computations. When memory is limited, the direct computation of Fourier Transform is a better option because it uses less memory at the expense of more computation. Successive frequency component elimination may be used to achieve higher dynamic range.

Figure 6:
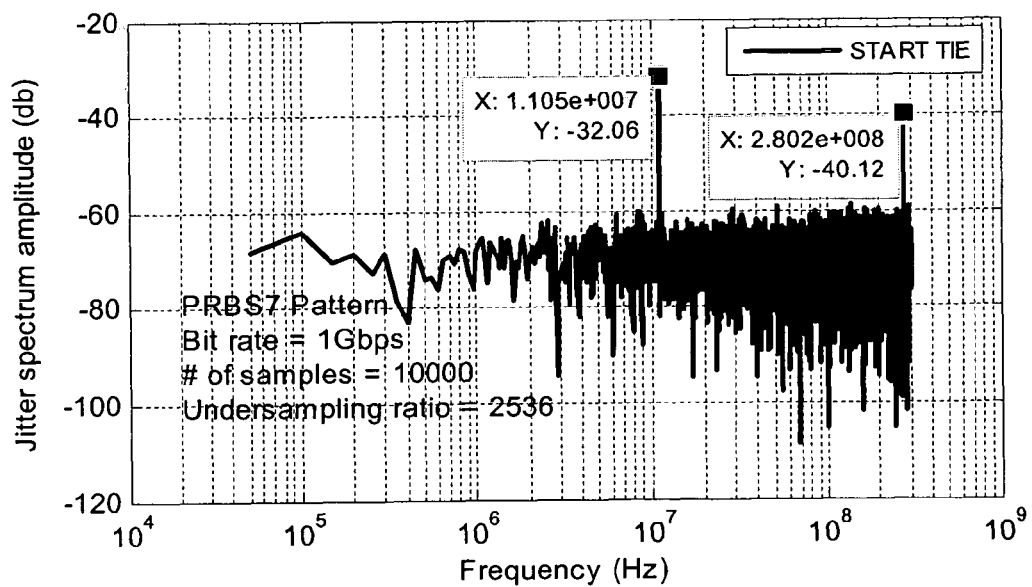
FIG. 6 illustrates normalized jitter spectrum obtained from a random sampling methodology in accordance with the present subject matter.

FIG. 6 shows example simulation results of random sampling application for jitter spectral analysis. In this example, the bit rate is 1 Gbps and the jitter amplitude is normalized to the average UI. A random jitter of 1 ps RMS and three sinusoidal jitter components are injected in the data signal as follows:

Component 1: −26 db @ 11.05 MHz (50 ps @ 11.05 MHz)
Component 2: −34 db @ 28.5 MHz (20 ps @ 28.5 MHz)
Component 3: −52 db @ 280.2 MHz (2.5 ps @ 280.2 MHz)

Figure 8:
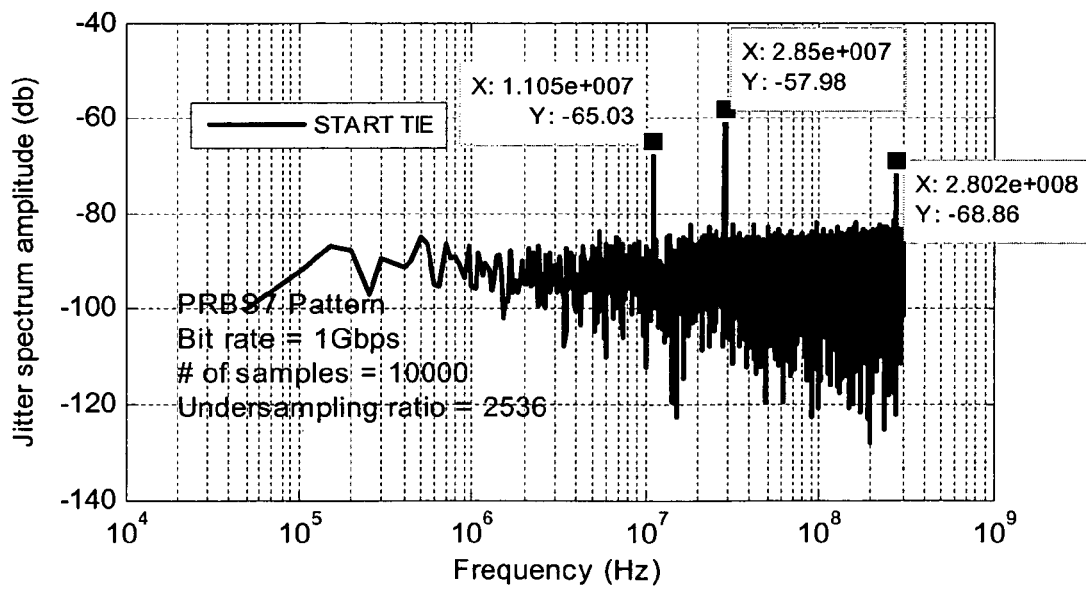
FIG. 8 illustrates the dynamic range enhancement obtained through successive elimination with random sampling from simulation.

The plot shows the single-sided spectrum, which will result in components amplitude to be 6 db (50%) below the injected amplitudes. The noise floor is 60 db mostly due to the leakage of randomized alias components. As expected, two components of −32 db @ 11.05 MHz and −40 db @ 2 80.2 MHz are clearly visible, but the smaller component of −58 db @ 28.5 MHz is not discernable from the noise floor. The dynamic range is 30 db, which prevents detection of small sinusoidal components. FIG. 8 shows the spectral plot after successive elimination technique. This technique reveals the −58 db @ 28.5 MHz component and improves the effective dynamic range to 50 db. The other two components are the residual of eliminated components.

Jitter spectrum plot illustrates jitter frequency components within a finite frequency range and with a limited frequency resolution. Frequency resolution is a function of autocorrelation sequence length and windowing function. The maximum frequency is set by the equivalent sampling rate, while the minimum is set by frequency resolution. In other words:

$$f_r = \frac{1}{N_A \cdot UI \cdot \alpha_w}$$ Eq. 26

$$f_{max} = \frac{1}{UI}$$

$$f_{min} = \frac{1}{N_A \cdot UI}$$

where, $f_r$ is the frequency resolution, $f_{min}$ and $f_{max}$ are the minimum and maximum points of jitter spectral frequency range, $N_A = K \cdot N$ is the length of $\hat{x}_s(t) \cdot \alpha_w$ is the windowing related frequency resolution reduction factor, which can be defined as 6 db bandwidth of the windowing sequence FFT. For example, $\alpha_w = 1.9$ for a Kaiser window with parameter $\beta = 5.6$.

Data-Dependent (DDJ) Jitter source is primarily inter-symbol interference (ISI) and is totally correlated with the bit pattern in the data stream. In many test condition, a finite length pattern is repeated within the data stream to exercise the performance of device under test (DUT). Due to the periodic repetition of the bit pattern, DDJ manifests itself as periodic jitter. DDJ frequency components can cause high noise floor in jitter spectrum from random sampling. To reduce the noise floor, it is recommended to eliminate the DDJ from TIE data.

In the following comparisons among the performance of the direct autocorrelation, N-variance, and RS methods with CTIA data for jitter spectrum analysis will be presented. In all cases, the jitter is normalized to the UI and expressed in db. A signal with the properties listed in Table 1 has been used for the comparisons. To highlight the intrinsic characteristics of each method, we chose the small RJ of less than 2.1 ps RMS in simulation and experimental setups, which reduces the RJ role in determining the dynamic range to a negligible level.

TABLE 1

| Jitter parameters used for jitter spectrum validation | |
|---|---|
| Data rate (UI) | 1 Gbps (100 ps) |
| Pattern | PRBS7 |
| Random jitter (RJ) - simulation | 1 ps |
| Random jitter (RJ) - measurement | 2.1 ps |
| Periodic jitter (PJ) - simulation | 1. −26 db[1]@11.05 MHz (50 ps@11.05 MHz) 2. −56 db[1]@28.5 MHz (20 ps@28.5 MHz) 3. −34 db[1]@280.2 MHz (2.5 ps@280.2 MHz) |
| Periodic jitter (PJ) - measurement | 18 db[1]@1.235 MHz (127 ps@1.235 MHz) |

[1]Defined as a ratio of the UI

Figure 4:
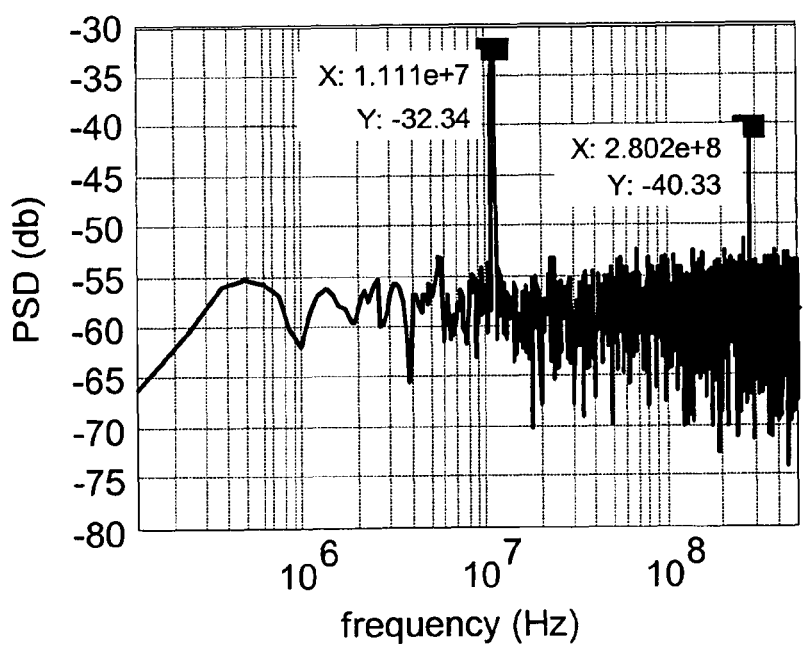
FIG. 4 illustrates the single-sided jitter power spectral density (PSD) obtained from a direct autocorrelation method.

FIG. 4 illustrates the single-sided jitter power spectral density (PSD) from direct autocorrelation method. In this example, 480,000 samples are used such that the time intervals span 1 bit to 4800 bit intervals. The CTIA is programmed for 5 μs effective sampling rate. This sampling yields $M_m$ ☐ 100 and frequency resolution of $f_r$ ☐ 1/(4800·UI)=208.3 kHz. Two peaks at 11.05 MHz and 280.2 MHz are visible in the PSD. The peaks are 6 db less than the injected amounts; this is expected because the single-sided spectrum includes only half of the signal power. The dynamic range is approximately 21 db. Due to limited dynamic range, the −56 db component at 28.5 MHz cannot be clearly observed.

The measurement time for this example is close to 3 s. For production test applications, where the frequency resolution and dynamic range requirements are more relaxed, 20,000 to 100,000 samples are sufficient. Test time in such cases is within 150 ms to 800 ms, and the expected accuracy is between 5% and 10%.

Figure 5:
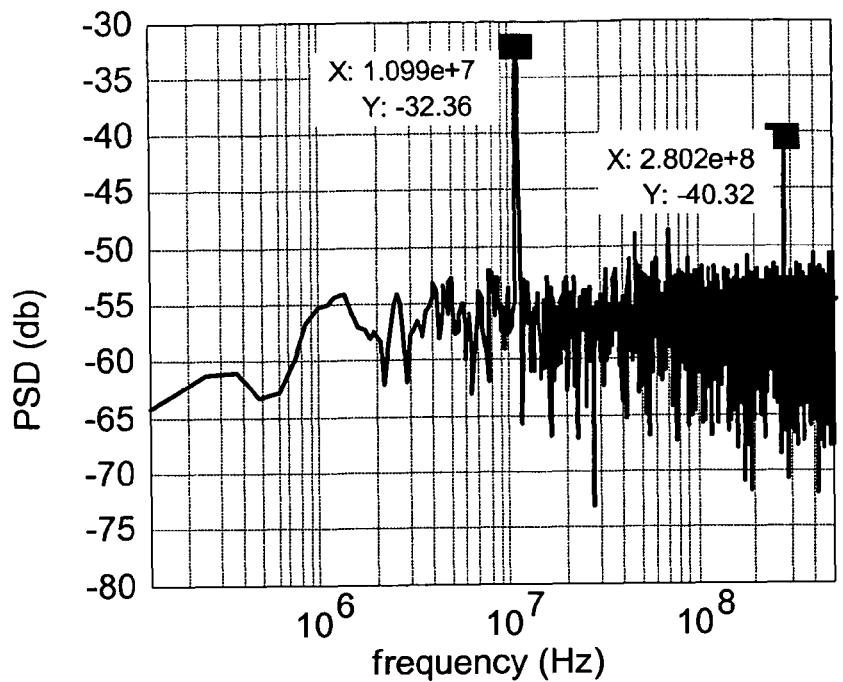
FIG. 5 illustrates the simulated jitter power spectrum density obtained from an N-Variance method.

FIG. 5 illustrates the simulated PSD derived from N-variance method for the same sampling regime as before. Similar to the direct autocorrelation, N-variance method identifies the major jitter frequency components. The dynamic range is, however, close to 18 db, which is 3 db less than the direct-autocorrelation method, as expected.

FIG. 6 shows the simulated jitter spectrum obtained from random sampling method. The number of samples used is 10,000. The average sampling interval is 2.635 μs, which yields an under sampling ratio of 2635. The frequency resolution is 1/(10000*2.635e−6)=39 Hz and dynamic range is better than 28 db. The sampling time is only 26.4 ms while the processing time ranges between 100 ms, if hardware co-processors (e.g., FPGA) are used, to a few minutes on a typical Pentium® 4 2.8 GHz machine with 2 GB RAM.

To verify the random sampling method in practice, we generated a data signal, which included periodic jitter using an Agilent 81133 pulse generator for jitter injections. The signal and jitter parameters are given in Table 1. We used the random arming mode in GuideTech's GT4000 CTIA to acquire time stamps in a pseudo-random fashion. The sampling process was adjusted to obtain the same average sampling rate as that of simulations. After computing the TIE sequence for the sampled edges, we applied the RS algorithm to compute jitter spectrum.

Figure 7:
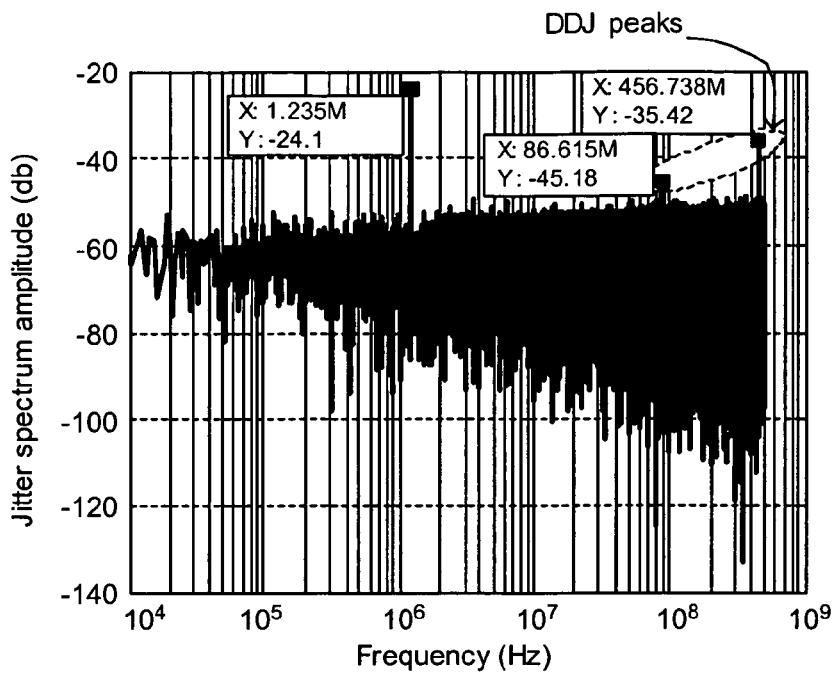
FIG. 7 illustrates the measured jitter spectrum obtained from random sampling methodology in accordance with the present subject matter.

The results, shown in FIG. 7, demonstrate the RS method ability to detect not only the injected PJ at 1.235 MHz correctly, but also detect the DDJ related peaks at much higher frequencies that appear as periodic jitter components due to the repeating nature of pattern. The DDJ components can be isolated to estimate DDJ through inverse FFT operation. This experiment also validates the 28 db dynamic range predicted from the simulations for 10000 samples.

FIG. 8 demonstrates the dynamic range enhancement resulting from successive elimination for simulated data. In this example, the phases and amplitudes of the two larger components at 11.05 MHz and 280.2 MHz are estimated and their corresponding sinusoidal waveforms are subtracted from the samples in time domain. Upon analysis of the new signal, the −58 db component at 28.5 MHz is clearly detectable. The residual components at 11.05 Mhz and 280.2 MHz are due to errors in estimating the amplitude and phase of each component before elimination.

The CTIA architecture is capable of measuring the occurrence time (time stamp) and event number of many edges relative to a unique reference. We described two jitter spectrum analysis methodologies that can use the under sampled CTIA data to analyze jitter spectrum up to frequencies much higher than the effective sampling rate. The first method uses an estimate of autocorrelation function from the TIE estimates. This method provides more accuracy and dynamic range than the N-variance class of algorithms for the same number of samples. The second method is based on anti-aliasing feature of random sampling. This method uses the TIE estimates for randomly or pseudo-randomly selected edges to construct the jitter spectrum up to very high frequencies without aliasing even though the CTIA average sampling rate may be a few hundred or thousand times less than the maximum jitter frequency.

RS technique provides phase information in addition to the amplitude, while autocorrelation methods only provide amplitude information. The phase information enables time domain reconstruction of periodic jitter signals. It also allows for implementation of successive elimination technique to enhance the dynamic range while using only a fraction of samples required by autocorrelation methods.

RS method can provide frequency resolution less than 100 Hz, which can be a great diagnostic tool when looking for different jitter sources. In addition, RS technique can detect low frequency modulations, such as spread-spectrum clock (SSC) in digital systems, very accurately with small number of samples within a few milliseconds (sampling time).

Several issues have to be considered when using the RS method. It requires significantly more computational resources than the autocorrelation methods. Availability of inexpensive computational power in many systems, however, reduces the importance of this limitation. Also, significantly shorter sampling time offsets the longer processing time. It exhibits somewhat higher sensitivity to some data patterns, especially very short ones, such as K28.5, because such patterns do not allow high degree of sampling randomization. It may show significant noise floor in the presence of large amounts of low frequency random jitter in the signal, which will limit the dynamic range, but superior performance has been observed from the random sampling method in most other situations.

The RS method, as described herein, is more suitable for characterization and debug applications, primarily due to the data processing time and sensitivity to some data patterns. However, for clocks and pseudo-random patterns, the use of dedicated signal processing engines can reduce the test time to 100 ms to 200 ms, which renders it practical for production test applications.

Both the autocorrelation and RS methods are effective for identifying the jitter periodic components within their corresponding dynamic range limit. Both methods include a synthetic noise floor due to statistical randomization of periodic jitter components, although the mechanism for generation of the synthetic noise floor is different in the two methods. Such synthetic floor may dominate the random jitter that appears in the noise floor. To view and measure the random jitter spectral content, the synthetic noise floor should be attenuated sufficiently, e.g., through successive elimination technique described herein for RS method. Alternatively, other methods may be used for measuring RJ with CTIA.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for analyzing jitter in a signal pattern, comprising:
   using a time interval analyzer to sample a sequence of N edge timings such that the number of events between any two samples is selected randomly;
   electronically estimating an average unit interval UI from the sequence of edge timing data;
   electronically computing a time interval error TIE for each sampled edge; and
   electronically calculating and displaying the jitter spectrum content of the sampled signal pattern.

2. The method of claim 1, wherein each sampled edge timing is associated with a start edge timing and further comprising:
   associating a stop edge timing with each sampled start edge timing,
   whereby the difference between the edge start and its associated stop edge defines a time interval.

3. The method of claim 2, wherein the stop edge time is randomly selected for each time interval.

4. The method of claim 2, wherein TIE is computed using the relationships:

$$TIE_{ST}(i)=t(i)-b_{ST}(i)*UI$$

$$TIE_{SP}(i)=t(i)+P(i)-b_{SP}(i)*UI$$

wherein for each sample i, t(i) is the start time, $b_{ST}(i)$ and $b_{SP}(i)$ are the bit numbers or clock cycle number associated with start and stop edges of the sample, P(i) is the time interval between start and stop edges, and UI is the average unit interval.

5. The method of claim 4 wherein the start time event in each interval is selected by providing a sequence of randomly selected integers with mean zero plus a constant integer.

6. The method of claim 2 wherein the stop edge occurrence is a fixed number of events following the start edge.

7. The method of claim 4, further comprising applying a windowing function to the sampled start or stop TIE sequence prior to calculating and displaying the jitter spectrum content.

8. The method of claim 7, further comprising applying a scaling factor to normalizing the samples to the maximum sampled value.

9. The method of claim 1, further comprising synchronizing the samples with a pattern edge in the sampled block 10. The method of claim 1, further comprising the step of subtracting the data dependant jitter DDJ component from each edge or TIE sequence for each interval prior to calculating and displaying the jitter spectrum content.

11. The method of claim 1, wherein the jitter spectrum content is calculated using a Fourier Transform technique.

12. The method of claim 11, wherein the Fourier Transform is a Fast Fourier Transform (FFT).

13. The method of claim 11, wherein the Fourier Transform is calculated using a Sinusoidal Correlation technique.

14. The method of claim 11, further comprising:
detecting the value of the largest frequency components within the sample; and
subtracting the detected value from the sample signal prior to calculating and displaying the jitter spectrum content.

15. The method of claim 14, further comprising repeating the steps of detecting and subtracting.

* * * * *